United States Patent
Wu et al.

(10) Patent No.: US 11,487,129 B2
(45) Date of Patent: Nov. 1, 2022

(54) OPTICAL INTEGRATION DEVICE

(71) Applicant: TRIPLE WIN TECHNOLOGY(SHENZHEN) CO.LTD., Shenzhen (CN)

(72) Inventors: Jia-Liang Wu, Shenzhen (CN); Yi-Yin Chen, Shenzhen (CN)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 401 days.

(21) Appl. No.: 16/872,692

(22) Filed: May 12, 2020

(65) Prior Publication Data
US 2021/0325685 A1  Oct. 21, 2021

(30) Foreign Application Priority Data
Apr. 16, 2020 (CN) .......................... 202010301430.2

(51) Int. Cl.
*G02B 27/09* (2006.01)
*H05K 1/11* (2006.01)
*G02B 27/42* (2006.01)
*H05B 47/115* (2020.01)
(Continued)

(52) U.S. Cl.
CPC ..... *G02B 27/0944* (2013.01); *G02B 27/4233* (2013.01); *H05K 1/111* (2013.01); *H01R 12/51* (2013.01); *H05B 47/115* (2020.01); *H05K 1/112* (2013.01); *H05K 1/18* (2013.01); *H05K 2201/01* (2013.01); *H05K 2201/0183* (2013.01);
(Continued)

(58) Field of Classification Search
CPC .......... H05K 1/111; H05K 1/112; H05K 1/18; H05K 2201/01; H05K 2201/0183; H05K 2201/09372; H05K 2201/0939; H01R 12/51; G02B 27/0944; G02B 27/4233; H05B 47/115
See application file for complete search history.

(56) References Cited

U.S. PATENT DOCUMENTS

| | | | | |
|---|---|---|---|---|
| 2002/0040810 A1* | 4/2002 | Laffoley | ................. | H01L 24/16 174/255 |
| 2019/0110365 A1* | 4/2019 | Taketomi | ............... | H05K 3/341 |
| 2022/0192013 A1* | 6/2022 | Itou | ....................... | H05K 1/0296 |

FOREIGN PATENT DOCUMENTS

| | | |
|---|---|---|
| CN | 103080801 A | 5/2013 |
| JP | 2006-319044 A | 11/2006 |

* cited by examiner

*Primary Examiner* — Paresh Paghadal
(74) *Attorney, Agent, or Firm* — ScienBiziP, P.C.

(57) ABSTRACT

An optical integration device includes a first circuit layer comprising a first surface adjacent a first diffractive layer, the first diffractive layer arranged on a side of the first circuit layer along a first direction, and a first connecting pad electrically connected with the first circuit layer through a first conductive member. The optical integration device includes a side surface extending along the first direction. The side surface defines a first concavity extending through the first diffractive layer along the first direction. The first connecting pad includes a first mounting member connected with the side surface, and a first convex member extending from the first mounting member and received in the first concavity. The first conductive member includes a first conductive part arranged between the side surface and the first mounting member, and a second conductive part arranged between the first surface and the first convex member.

20 Claims, 6 Drawing Sheets

(51) Int. Cl.
*H01R 12/51* (2011.01)
*H05K 1/18* (2006.01)
(52) U.S. Cl.
CPC ............... *H05K 2201/0939* (2013.01); *H05K 2201/09372* (2013.01)

US 11,487,129 B2

OPTICAL INTEGRATION DEVICE

The subject matter herein generally relates to optical technologies, and particularly to an optical integration device.

BACKGROUND

An optical integration device is mainly used in 3D face recognition. Its function is to disperse a beam of light into multiple beams and reshape them, so as to achieve the desired spot effect. At present, a circuit layer of an optical integration device is connected with a pad through a metal sheet. However, due to the small contact area between the circuit layer and the metal sheet, it is easy to cause fractures between the circuit layer and the metal sheet, so that the circuit layer and the pad cannot be electrically connected, and finally the optical integration device may stop working.

BRIEF DESCRIPTION OF THE DRAWINGS

Implementations of the present disclosure will now be described, by way of embodiment, with reference to the attached figures.

DETAILED DESCRIPTION

Figure 1:
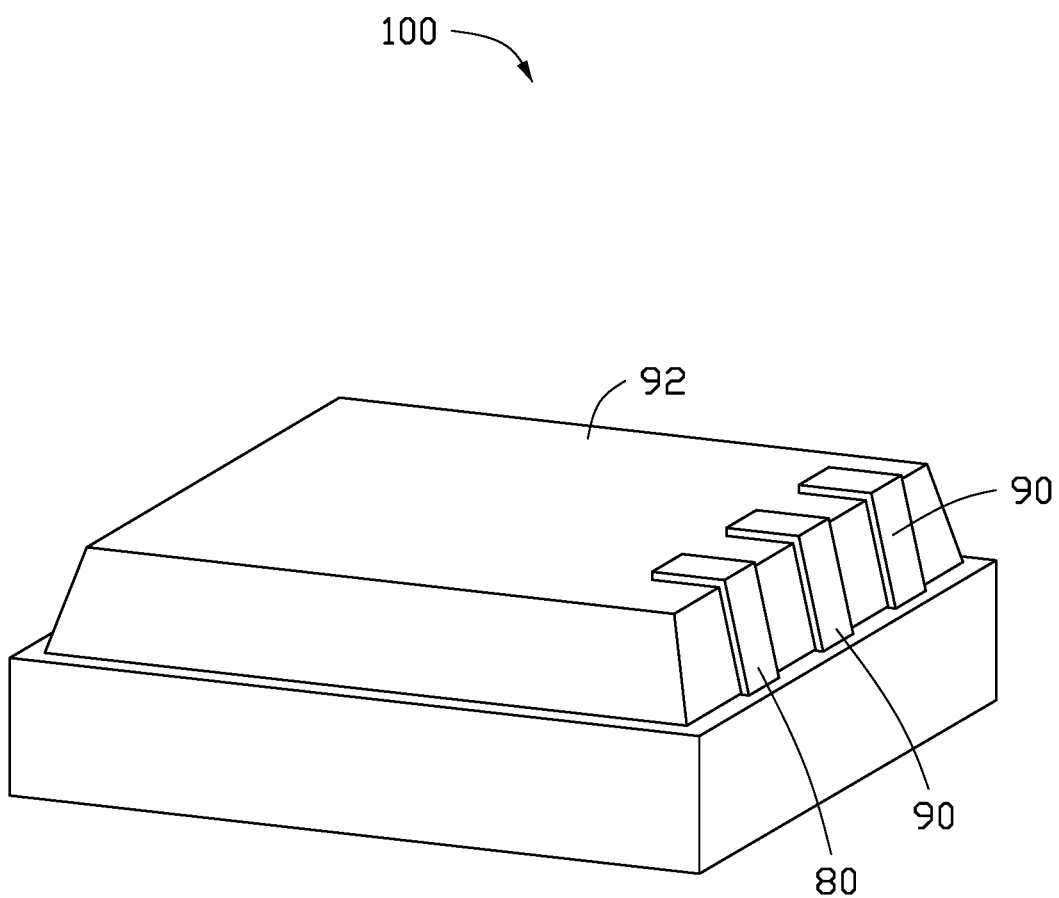
FIG. 1 illustrates an embodiment of a schematic diagram of an optical integration device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". In addition, the terms "first" and "second" are used for descriptive purposes only and cannot be understood as indicating or implying relative importance or implying the number of indicated technical features. Thus, the features defined as "first" and "second" may explicitly or implicitly include one or more of the said features. In the description of embodiments of the invention, "multiple" means two or more, unless otherwise specifically defined.

The terms "center", "length", "width", "thickness", "top", "bottom", "front", "back", "left", "right", "vertical", "horizontal", "inside", "outside", and other indicating directions or positions are based on the directions or positions shown in the attached drawings. In order to facilitate the description of the embodiment and simplify the description of the invention, rather than indicating or implying that the device or element referred to must have a specific orientation, be constructed and operated in a specific orientation, it cannot be understood as a limitation of the embodiment of the invention.

Figure 2:
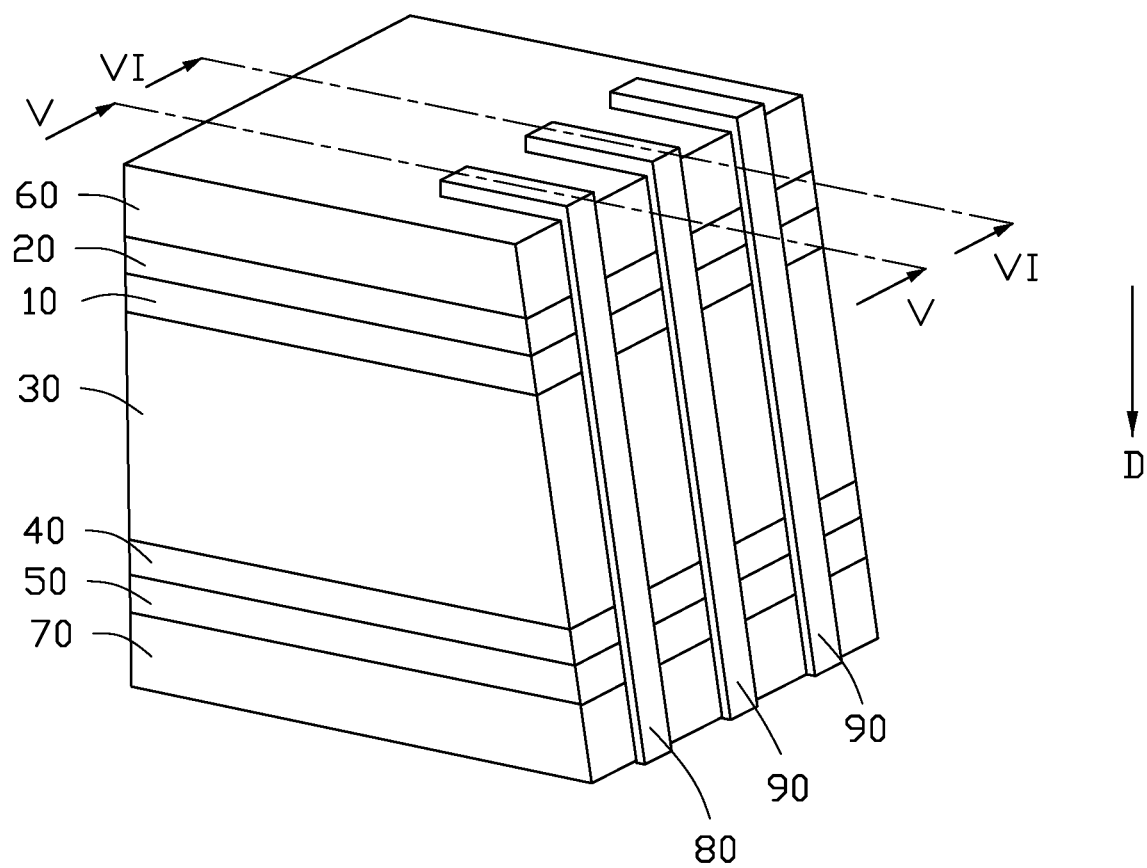
FIG. 2 illustrates an embodiment of a schematic diagram of the optical integration device of FIG. 1, with a case thereof being removed.

Referring to FIGS. 1-2, an embodiment of the present disclosure provides an optical integration device 100. The optical integration device 100 incudes a first substrate 60, a first circuit layer 20, a first diffractive layer 10, a dielectric layer 30, a second diffractive layer 40, a second circuit layer 50, and a second substrate 70 arranged in sequence along a first direction D.

Figure 3:
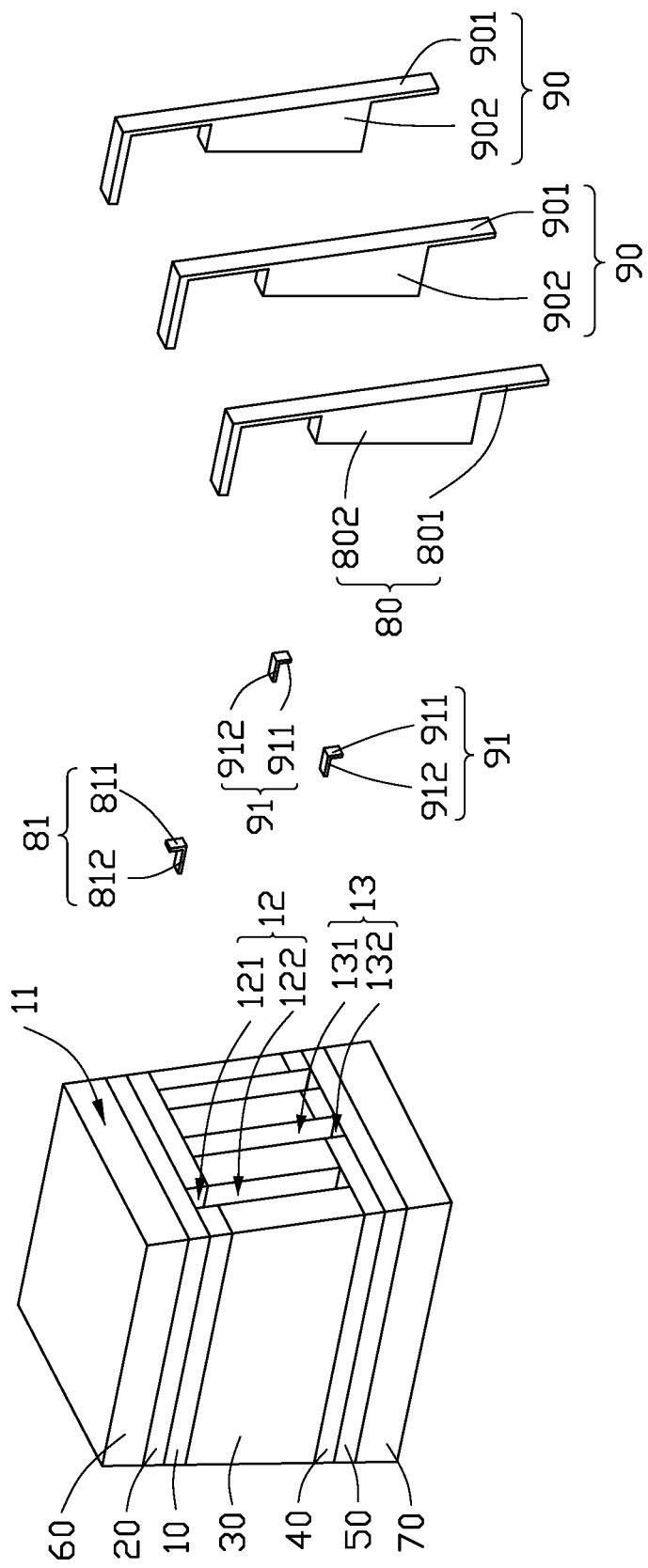
FIG. 3 illustrates an exploded view of the optical integration device of FIG. 2.

Referring to FIG. 3, in the embodiment, the optical integration device 100 further includes a side surface 11. The side surface 11 defines a first concavity 12 extending through the first diffractive layer 10 along the first direction D. In at least one embodiment, the first concavity 12 further extends through the dielectric layer 30. The first concavity 12 includes a first concave portion 121 and a second concave portion 122 communicating with the first concave portion 121. The first concave portion 121 extends through the first diffractive layer 10, and the second concave portion 122 extends through the dielectric layer 30.

The first circuit layer 20 includes a first surface 21 (shown in FIG. 4) adjacent to the first diffractive layer 10. The first surface 21 is connected with part of the side surface 11 corresponding to the first circuit layer 20.

Figure 4:
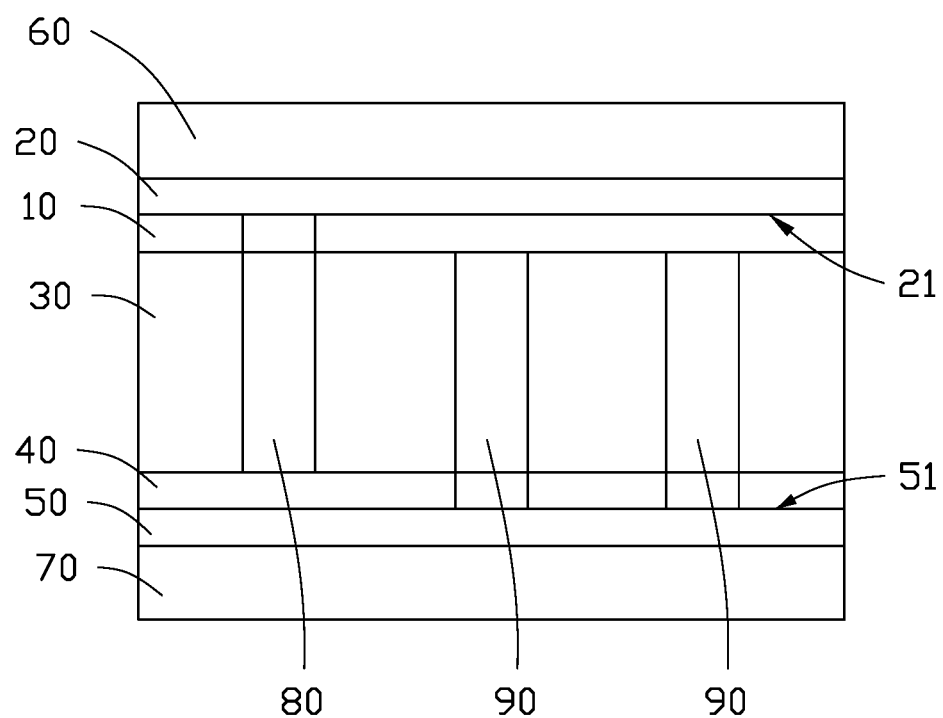
FIG. 4 illustrates a front view of the optical integration device of FIG. 2.
Figure 5:
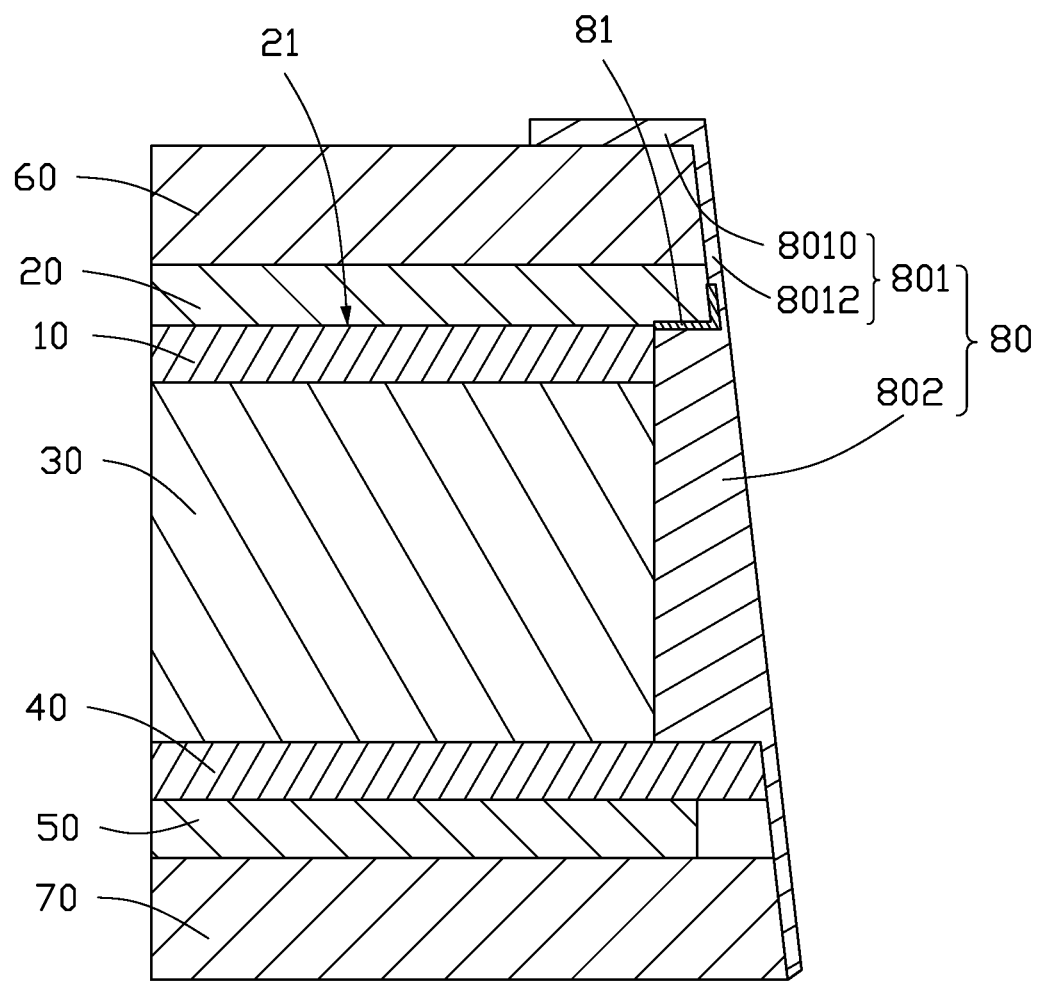
FIG. 5 illustrates a cross sectional view of the optical integration device of FIG. 2 along line V-V.
Figure 6:
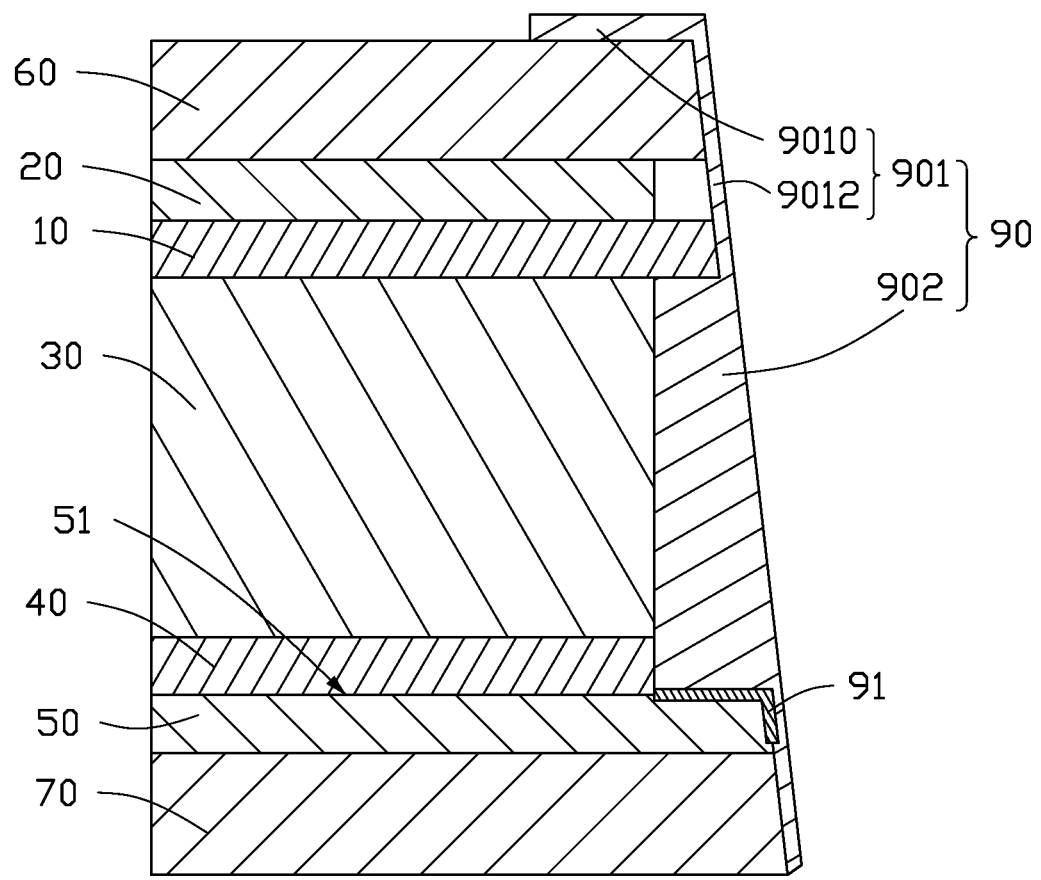
FIG. 6 illustrates a cross sectional view of the optical integration device of FIG. 2 along line VI-VI.

Referring to FIGS. 3-5, the optical integration device 100 further includes a first connecting pad 80. The first connecting pad 80 is electrically connected with the first circuit layer 20, and part of the first connecting pad 80 is received in the first concavity 12. The first connecting pad 80 includes a first mounting member 801 and a first convex member 802 extending from the first mounting member 801. The first mounting member 801 includes a first mounting portion 8010 arranged at a side of the first substrate 60 away from the first circuit layer 20, and a second mounting portion 8012 extending along the first direction D and connected with the side surface 11. The first convex member 802 is convex towards the first concavity 12 from the first mounting member 801. The first convex member 802 is corresponding to the first concavity 12 and received in the first concavity 12.

The first connecting pad 80 is electrically connected with the first circuit layer 20 with a first conductive member 81. The first conductive member 81 is connected with both the side surface 11 and the first surface 21. The first conductive member 81 is substantially shaped as a "L". The first conductive member 81 includes a first conductive part 811 and a second conductive part 812 connected with the first conductive part 811. The first conductive part 811 is arranged between the side surface 11 and the first mounting member 801, and the second conductive part 812 is arranged between the first surface 21 and the first convex member 802. The first conductive member 81 can be a piece of metal, such as a piece of copper.

The side surface 11 defines the first concavity 12 thereon, the first mounting member 801 of the first connecting pad 80 is arranged on the side surface 11, and the first convex member 802 is received in the first concavity 12, which allow the first conductive member 81 is connected not only with part of the side surface 11 corresponding to the first circuit layer 20 but also with the first surface 21, thus increasing a contact area between the first conductive member 81 and the first circuit layer 20 to enhance connecting stability between the first circuit layer 20 and the first connecting pad 80. Therefore, reliability of the optical integration device 100 is enhanced.

Referring to FIG. 3, the side surface 11 further defines at least one second concavity 13. The at least one second concavity 13 extends through the second diffractive layer 40 along the first direction D. In at least one embodiment, the at least one second concavity 13 further extends through the dielectric layer 30. In the embodiment, a number of the at least one second concavity 13 is two, each of the two second concavities 13 includes a third concave portion 131 and a fourth concave portion 132 communicating with the third concave portion 131. The third concave portion 131 extends through the second diffractive layer 40, and the fourth concave portion 132 extends through the dielectric layer 30.

The second circuit layer 50 includes a second surface 51 (shown in FIG. 4) adjacent to the second diffractive layer 40. The second surface 51 is connected with part of the side surface 11 corresponding to the second circuit layer 50.

Referring to FIGS. 3-6, the optical integration device 100 further includes at least one second connecting pad 90. The at least one second connecting pad 90 is electrically connected with the second circuit layer 50, and part of the at least one second connecting pad 90 is received in the second concavity 13. In the embodiment, a number of the at least one second connecting pad 90 is two, each of the two second connecting pads 90 includes a second mounting member 901 and a second convex member 902 extending from the second mounting member 901. The second mounting member 901 includes a third mounting portion 9010 arranged at a side of the first substrate 60 away from the first circuit layer 50, and a fourth mounting portion 9012 extending along the first direction D and connected with the side surface 11. The second convex member 902 is convex towards the second concavity 13 from the second mounting member 901. The second convex member 902 is corresponding to the second concavity 13 and received in the second concavity 13.

Each of the second connecting pads 90 is electrically connected with the second circuit layer 50 with a second conductive member 91. The second conductive member 91 is connected with both the side surface 11 and the second surface 51. The second conductive member 91 is substantially shaped as a "L". The second conductive member 91 includes a third conductive part 911 and a fourth conductive part 912 connected with the third conductive part 911. The third conductive part 911 is arranged between the side surface 11 and the second mounting member 901, and the fourth conductive part 912 is arranged between the second surface 51 and the second convex member 902. The second conductive member 91 can be a piece of metal, such as a piece of copper.

The two second connecting pads 90 can be arranged on a same side of the first connecting pad 80. In at least one embodiment, the two second connecting pads 90 can be arranged on two opposite sides of the first connecting pad 80. In at least one embodiment, the two second connecting pads 90 can be substantially parallel to each other.

The side surface 11 defines the second concavity 13 thereon, the second mounting member 901 of the second connecting pad 90 is arranged on the side surface 11, and the second convex member 902 is received in the second concavity 13, which allow the second conductive member 91 being connected not only with part of the side surface 11 corresponding to the second circuit layer 50 but also with the second surface 51, thus increasing a contact area between the second conductive member 91 and the second circuit layer 50 to enhance connecting stability between the second circuit layer 50 and the second connecting pad 90. Therefore, reliability of the optical integration device 100 is enhanced.

Referring back to FIG. 1, in the embodiment, the optical integration device 100 further includes a case 92. The case 92 defines a receiving area (not shown) for accommodating the first substrate 60, the first circuit layer 20, the first diffractive layer 10, the dielectric layer 30, the second diffractive layer 40, the second circuit layer 50, and the second substrate 70. Part of the first connecting pad 80 and part of the second connecting pad 90 are exposed to outside of the case 92. In detail, the first mounting member 801 and the second mounting member 901 are exposed to the outside of the case 92.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:
1. An optical integration device, comprising:
a first circuit layer comprising a first surface;
a first diffractive layer arranged on a side of the first circuit layer along a first direction and adjacent to the first surface; and
a first connecting pad electrically connected with the first circuit layer through a first conductive member;
wherein the optical integration device includes a side surface extending along the first direction; the side surface defines a first concavity extending through the first diffractive layer along the first direction; the first connecting pad includes a first mounting member connected with the side surface, and a first convex member extending from the first mounting member and received in the first concavity; the first conductive member includes a first conductive part arranged between the side surface and the first mounting member, and a second conductive part arranged between the first surface and the first convex member.

2. The optical integration device according to claim 1, the first conductive member is a piece of metal.

3. The optical integration device according to claim 1, further comprising a dielectric layer arranged on a side of the first diffractive layer away from the first circuit layer along the first direction.

4. The optical integration device according to claim 3, wherein the first concavity incudes a first concave portion extending through the first diffractive layer and a second concave portion extending through the dielectric layer, the first convex portion is received in the first concave portion and the second concave portion.

5. The optical integration device according to claim 3, further comprising a second diffractive layer and a second circuit layer arranged in sequence on a side of the dielectric layer away from the first diffractive layer along the first direction.

6. The optical integration device according to claim 5, further comprising at least one second connecting pad electrically connected with the second circuit layer.

7. The optical integration device according to claim 6, wherein the at least one second connecting pad is electrically connected with the second circuit layer through at least one second conductive member, the at least one second conductive member is arranged between the second circuit layer and the second connecting pad.

8. The optical integration device according to claim 7, the at least one second conductive member is a piece of metal.

9. The optical integration device according to claim 7, wherein the side surface defines at least one second concavity extending through the second diffractive layer, the at least one second connecting pad includes at least one second mounting member connected with the side surface and at least one second convex member received in the at least one second concavity.

10. The optical integration device according to claim 9, wherein the second circuit layer includes a second surface adjacent to the second diffractive layer, the at least one second conductive member includes a third conductive part arranged between the side surface and the second mounting member, and a fourth conductive part arranged between the second surface and the second convex member.

11. The optical integration device according to claim 10, wherein the at least one second concavity includes a third concave portion extending through the second diffractive layer and a fourth concave portion extending through the dielectric layer.

12. The optical integration device according to claim 10, wherein a number of the at least one second concavity is two, a number of the at least one second connecting pad is two, each of the at least one second concavity is corresponding to one of the at least one second connecting pad.

13. The optical integration device according to claim 12, wherein two second connecting pads are arranged on a same side of the first connecting pad, or arranged on two opposite sides of the first connecting pad respectively.

14. The optical integration device according to claim 13, wherein the two second connecting pads are substantially parallel to each other.

15. The optical integration device according to claim 9, further comprising a first substrate arranged on a side of the first circuit layer away from the first diffractive layer.

16. The optical integration device according to claim 15, wherein the first mounting member includes a first mounting portion arranged on a side of the first substrate away from the first circuit layer, and a second mounting portion arranged on the side surface.

17. The optical integration device according to claim 15, further comprising a second substrate arranged on a side of the second circuit layer away from the second diffractive layer.

18. The optical integration device according to claim 17, wherein the second mounting member includes a third mounting portion arranged on a side of the first substrate away from the first circuit layer, and a fourth mounting portion arranged on the side surface.

19. The optical integration device according to claim 17, further comprising a case, the case defines a receiving area for accommodating the first substrate, the first circuit layer, the first diffractive layer, the dielectric layer, the second diffractive layer, the second circuit layer, and the second substrate.

20. The optical integration device according to claim 19, part of the first connecting pad and/or part of the second connecting pad are exposed to outside of the case.

* * * * *